United States Patent
Diao et al.

(10) Patent No.: US 10,718,845 B2
(45) Date of Patent: Jul. 21, 2020

(54) METHOD AND DEVICE FOR DIAGNOSING PHASE CURRENT SENSOR DEFECTS IN CONTROL SYSTEM OF SYNCHRONOUS ROTARY ELECTRIC MACHINE OF MOTOR VEHICLE

(71) Applicant: VALEO EQUIPEMENTS ELECTRIQUES MOTEUR, Creteil (FR)

(72) Inventors: Sidath Diao, Saint Maur Des Fosses (FR); Zaatar Makni, Chilly Mazarin (FR); Demba Diallo, Palaiseau (FR)

(73) Assignee: Valeo Equipments Electriques Moteur, Creteil (FR)

( * ) Notice: Subject to any disclaimer, the term of this patent is extended or adjusted under 35 U.S.C. 154(b) by 451 days.

(21) Appl. No.: 15/512,312

(22) PCT Filed: Sep. 10, 2015

(86) PCT No.: PCT/FR2015/052424
§ 371 (c)(1),
(2) Date: Mar. 17, 2017

(87) PCT Pub. No.: WO2016/042238
PCT Pub. Date: Mar. 24, 2016

(65) Prior Publication Data
US 2017/0254872 A1 Sep. 7, 2017

(30) Foreign Application Priority Data

Sep. 17, 2014 (FR) ...................................... 14 58792

(51) Int. Cl.
*G01R 35/00* (2006.01)
*G01R 31/42* (2006.01)
(Continued)

(52) U.S. Cl.
CPC ........... *G01R 35/005* (2013.01); *G01R 25/00* (2013.01); *G01R 31/42* (2013.01); *H02P 6/12* (2013.01);
(Continued)

(58) Field of Classification Search
CPC combination set(s) only.
See application file for complete search history.

(56) References Cited

U.S. PATENT DOCUMENTS 9,372,234 B2 * 6/2016 Wang ................. G01R 31/3191
2014/0156144 A1 6/2014 Hoshi et al.
(Continued)

OTHER PUBLICATIONS

Clarke & Park Transforms on the TMS320C2xx, Application Report Literature No. BPRA048 (Texas Instruments Incorporated (c) 1997). (Year: 1997).*

(Continued)

*Primary Examiner* — Alexander Satanovsky
*Assistant Examiner* — Mark I Crohn
(74) *Attorney, Agent, or Firm* — Berenato & White, LLC

(57) ABSTRACT

The method according to the invention enables the diagnosis (15, 16) of phase current sensor defects in a system for controlling a synchronous rotary electrical machine of a motor vehicle. According to the invention, the method takes into account the differences (îd, îq) between measurements provided (14) by the sensors, and nominal values of the phase currents (ia, ib, ic) in order to diagnose defects. The differences are calculated (18) in a rotating Park reference frame (17) and are separate from an electromechanical model of the machine. The method detects sensor defects if the differences are substantially non-zero (19) and an offset sensor defect if a residual pulsation (ω res) of the differences is substantially equal to a measured speed (w) of the control system.

14 Claims, 3 Drawing Sheets

(51) Int. Cl.
  *H02P 6/16* (2016.01)
  *H02P 29/024* (2016.01)
  *G01R 25/00* (2006.01)
  *H02P 21/14* (2016.01)
  *H02P 6/12* (2006.01)
  *G01R 31/34* (2020.01)

(52) U.S. Cl.
  CPC ............... *H02P 6/16* (2013.01); *H02P 21/14* (2013.01); *H02P 29/0241* (2016.02); *G01R 31/343* (2013.01)

(56) References Cited

U.S. PATENT DOCUMENTS

2015/0134284 A1* 5/2015 Negre .................. H02P 6/16 702/66
2015/0188471 A1* 7/2015 Kim .................. H02P 21/22 318/400.02

OTHER PUBLICATIONS

Cheng Siwei et al, "Current measurement gain tuning for interior permanent magnet synchronous motor (IPMSM) drives using controlled short circuit tests", 2014 IEEE Conference and Expo Transportation Electrification Asia-Pacific (Itec Asia-Pacific), IEEE, (Aug. 31, 2014), doi:10.1109/ITEC-AP.2014.6941238, pp. 1-6, XP032671796 [I] 1-8 * p. 2-p. 3 *.

Diao S et al, "Sensor fault diagnosis for improving the availability of electrical drives", IECON 2013—39th Annual Conference of the IEEE Industrial Electronics Society, IEEE, doi:10.1109/IECON. 2013.6699625, ISSN 1553-572X, (Nov. 10, 2013), pp. 3108-3113, (Dec. 30, 2013), XP032539761 [A] 1,4,8 * the whole document *.

Diao Sidath et al, "Current sensor fault diagnosis in the stationary frame for PMSM drive in automotive systems", 2014 Ninth International Conference on Ecological Vehicles and Renewable Energies (Ever), IEEE, (Mar. 25, 2014), doi:10.1109/EVER.2014. 6844143, pp. 1-7, XP032611866 [A] 1,4,8* the whole document *.

Shan Chai et al, "A Cascade MPC Control Structure for a PMSM With Speed Ripple Minimization", IEEE Transactions on Industrial Electronics, IEEE Service Center, Piscataway, NJ, USA, (Aug. 1, 2013) vol. 60, No. 8, doi:10.1109/TIE.2012.2201432, ISSN 0278-0046, pp. 2978-2987, XP011500186 [I] 1-8 * p. 2980 *.

Woohyun Hwang et al, "Model-based sensor fault detection algorithm design for Electro-Mechanical Brake", Intelligent Transportation Systems (ITSC), 2011 14TH International IEEE Conference on, IEEE, (Oct. 5, 2011), doi:10.1109/ITSC_2011.6083012, ISBN 978-1-4577-2198-4, pp. 962-967, XP032023407 [A] 1,4,8 * p. 962-p. 965 *.

* cited by examiner

METHOD AND DEVICE FOR DIAGNOSING PHASE CURRENT SENSOR DEFECTS IN CONTROL SYSTEM OF SYNCHRONOUS ROTARY ELECTRIC MACHINE OF MOTOR VEHICLE

CROSS-REFERENCE TO RELATED APPLICATIONS AND CLAIM TO PRIORITY

This application is a national stage application of International Application No. PCT/FR2015/052424 filed Sep. 10, 2015, which claims priority to French Patent Application No. 1458792 filed Sep. 17, 2014, the disclosures of which are incorporated herein by reference and to which priority is claimed.

FIELD OF THE INVENTION

The present invention relates to a method and a device for diagnosing phase current sensor defects in a system for controlling a synchronous rotary electrical machine of a motor vehicle.

The invention also relates to a synchronous rotary electrical machine comprising such a device, in particular a machine such as a permanent-magnet synchronous motor for applications in electrical and hybrid motor vehicles, electric power-assisted steering systems, air-conditioning compressors and fans.

BACKGROUND OF THE INVENTION

The number of electronic devices and electrical functions in systems installed in vehicles is continually increasing. This is due to their great flexibility in use, their compactness and their low maintenance requirement.

However their availability and their reliability represent a challenge, because they can be prone to failure.

Due to this mechanisms are envisaged very early on from the phase of their design, so as to facilitate the detection of defects, the diagnostics and suitable reconfiguration of the controls.

Much work has been carried out in the field of detection of faults of electrical control systems and their characterization.

The cases of current sensors, angular position sensor, and DC sensor of a control unit of a permanent-magnet synchronous motor are known state of the art, and good experimental results have been obtained, but few details are available on the question of isolating the fault in the case of current sensors.

For the person skilled in the art, the method most used for detection and characterization of the fault (FDI: English acronym for "Fault Detection and Isolation") is based on observing the behaviour of the actual system compared to an ideal model.

The differences which appear enable it to be decided if the system entails a fault or otherwise.

However this method presents many disadvantages.

In particular it is necessary to build a model taking into account all variable states of the system and it is difficult to replicate defects due to the resistive torque or the variation in speed for example, which are not faults.

To overcome these disadvantages, an alternative, based on an estimate originating from a system of differential equations concerning a philosophy regarding the difference between the measured phase currents and the nominal phase currents, was proposed in the article "Current Sensor Fault Diagnosis in Stationary Frame for PMSM Drive in Automotive Systems", S. Diao et al., 2014 Ninth International Conference on Ecological Vehicles and Renewable Energies, (EVER) IEEE.

However, the appraisers involved utilize electrical parameters which are not separate from the machine and are calculated in a stationary reference frame which does not allow all possible ways to simplify a control system to be used.

SUMMARY OF THE INVENTION

The aim of this invention is thus to take into account the properties of a control system in order to simplify calculation of these differences.

According to a first aspect, the invention relates to a method for diagnosing phase current sensor defects in a system for controlling a synchronous rotary electrical machine of a motor vehicle.

In accordance with the invention, the method takes into account differences $I_d$, $I_q$ between the measurements provided by the sensors and the nominal values of the phase currents in order to diagnose defects if the differences are substantially non-zero, these differences being calculated in a rotating Park reference frame and being separate from an electromechanical model of the machine, a faulty sensor among the sensors being identified by comparing to a measured electrical angle $\theta$ of the control system a residual electrical angle $\theta_{res}$ defined by the equation:

$$\theta_{res} = \arctan(-\tilde{I}_q/\tilde{I}_d)$$

where $\tilde{I}_d$ and $\tilde{I}_q$ are said differences.

According to a particular feature of the inventive method, an offset error of at least one of the sensors is detected if a residual pulsation of the differences is substantially equal to a measured speed of the control system.

According to another particular feature, a gain error of at least one of the sensors is detected if a residual pulsation of the differences is substantially equal to twice a measured speed of the control system.

According to another aspect, the invention also relates to a device for diagnosing phase current sensor defects in a system for controlling a synchronous rotary electrical machine of a motor vehicle capable of implementing the method briefly described above, of the type comprising:

means to acquire measurements provided by the sensors and an electrical angle of the control system;
means to digitally process the measurements; and
means to generate flags indicating sensor defects.

In accordance with the invention, the means of treatment perform a Park transformation and comprise means to analyze the waveforms of the phase currents in the Park reference frame, the means to analyze waveforms including means to calculate a time-weighted moving average.

According to a particular feature of the inventive diagnostic device, the means of acquisition moreover acquire a speed of the control system and the means of treatment moreover comprise means to detect an offset error and/or a gain error of at least one of the sensors as a function of said speed.

According to another particular feature, the means of treatment moreover comprise means to identify a faulty sensor among the sensors as a function of the electrical angle.

According to other aspects, the invention also relates to a synchronous rotary electrical machine including a diagnostic device as briefly described above, and a semiconductor memory designed to be integrated in the diagnostic device and containing a computer code representative of the method of the invention.

These few essential specifications will have rendered obvious to the person skilled in the art the advantages provided by the inventive method and device for diagnosing phase current sensor defects in a system for controlling a synchronous rotary electrical machine of a motor vehicle as well as by the synchronous rotary electrical machine and the associated computer memory, in comparison to the prior art.

The detailed specifications of the invention are given in the description below in conjunction with the appended drawings. It should be noted that these drawings have no other aim than to illustrate the text of the description and do not in any way constitute a limitation to the scope of the invention.

DETAILED DESCRIPTION OF THE PREFERRED EMBODIMENT(S)

Figure 1:
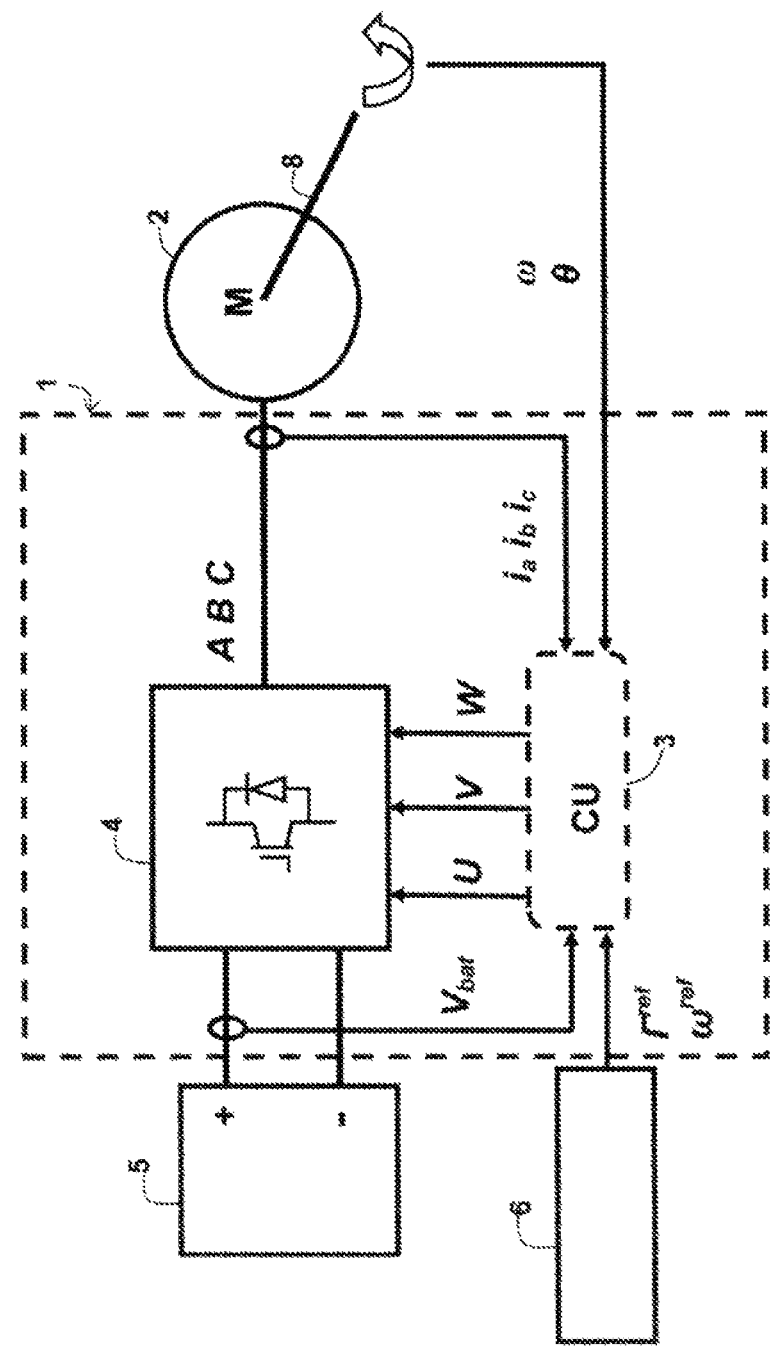
FIG. 1 is a general schematic diagram of a system for controlling a synchronous rotary electrical machine.

A control system 1 of a synchronous rotary electrical machine 2, such as that shown on FIG. 1, generally comprises a control unit 3 controlling an inverter 4 supplying the synchronous electrical machine 2 running from a DC source 5.

Measurements of the $V_{bat}$ direct voltage from the DC source 5, phase currents $I_a$, $I_b$, $I_c$ corresponding to the three phases A, B, C, of the electrical angle θ and the speed ω associated with the torque $I^{ref}$ and speed $ω^{ref}$ set points are usual inputs of the control unit 3.

This control unit 3 generates control signals U, V, W of inverter 4 so that the synchronous electrical machine 2 provides the necessary torque $I^{ref}$ at the specified speed $ω^{ref}$, parameters generally transmitted via a fieldbus 6.

Figure 2:
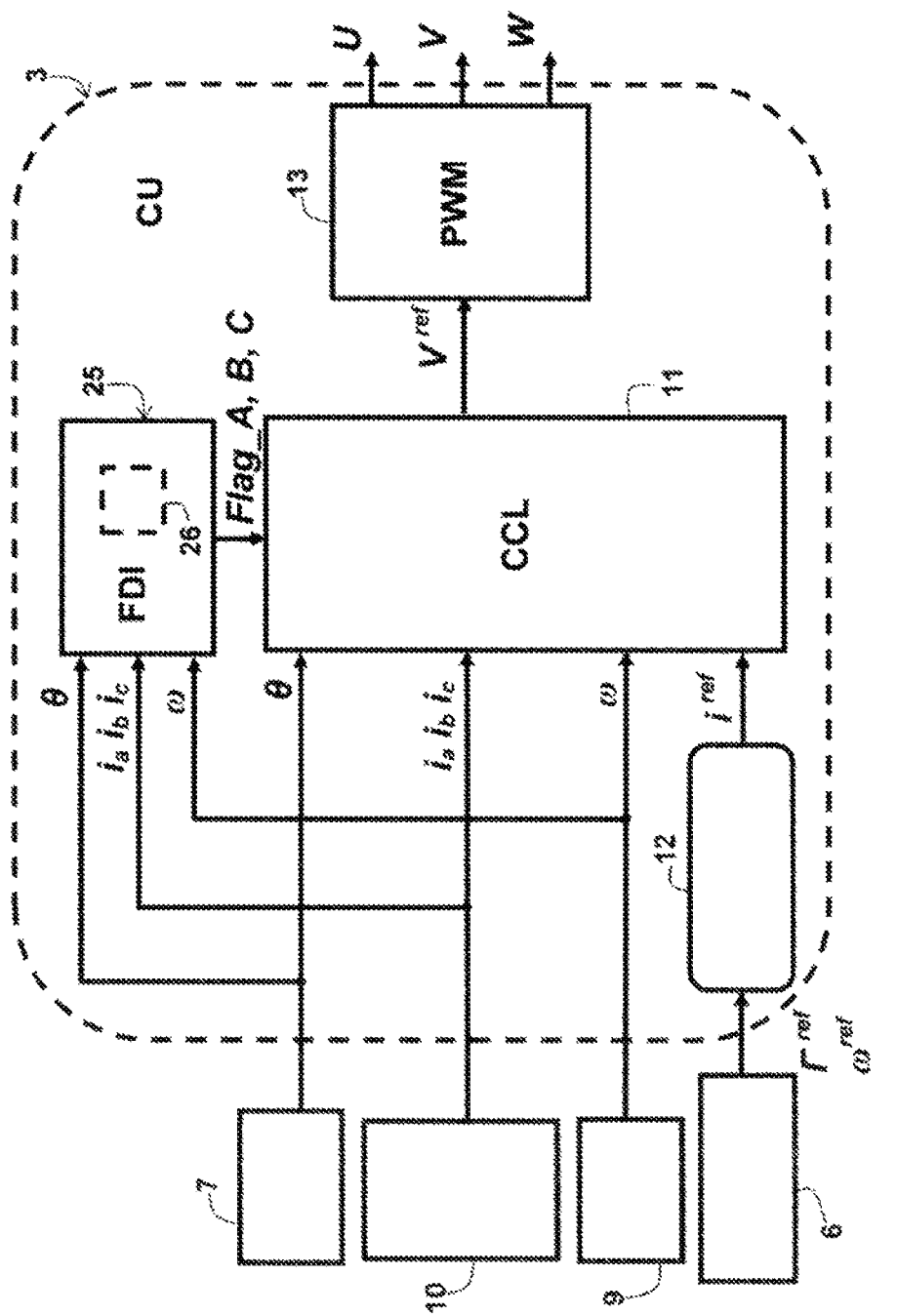
FIG. 2 is a schematic diagram of a control unit of the control system for a synchronous rotary electrical machine shown on FIG. 1 incorporating an inventive device for diagnosing phase current sensor defects.

FIG. 2 shows the principal components of the control unit 3.

The electrical angle θ of the control system 1 is provided to the control unit 3 by a position sensor 7 of a rotor 8 of the rotary synchronous electrical machine 2. Speed ω is provided by a speed sensor 9 or by a calculation based on the electrical angle θ.

Measurements of the phase currents $I_a$, $I_b$, $I_c$ are provided by phase current sensors 10.

They are precisely those phase current sensors 10 which can present defects, either an offset error or a gain error.

These defects are obviously prejudicial to the good performance of the control system 1 of the synchronous rotary electrical machine 2, and it is advisable to detect them and identify the faulty sensor.

The aim of the control unit 3 is to allow effective operation of the control system 1 within a wide range of torques and speeds.

For this purpose, a closed control loop 11 is necessary. The closed control loop 11 is a correcting module which ensures good control of the phase currents measured on the basis of a reference current $I^{ref}$.

A reference current calculation module 12 provides this reference current $I^{ref}$ based on the torque $I^{ref}$ or speed $ω^{ref}$ references and electrical parameters of the rotary electrical machine 2.

This reference current calculation module 12 converts a mechanical reference into an electrical reference.

After the reference voltages $V^{ref}$ have been calculated by the closed control loop 11, the pulse width modulation control unit 13 generates the pulse width modulated control signals U, V, W (or PWM: English acronym for "Pulse Width Modulation") of inverter 4.

With regard to the closed control loop 11, since it concerns a control system 1, control can be effected in various reference frames.

The well-known Clarke transformation is a projection of phase variables on two fixed axes (α, β).

Then the Clarke transformation can be followed by a rotation which converts the alternative components of the reference frame (α, β) into continuous components on direct and quadrature axes (reference frame (d, q)).

The combination of a Clarke transformation and a rotation of the reference frame (α, β) with the reference frame (d, q) is usually referred to as a Park transformation.

The main advantage of these transformations is a reduction in the order of the system (from 3 to 2) and the decoupling of the control variables.

Effective control of an electrical control system 1 requires that the instantaneous currents $I_a$, $I_b$, $I_c$ are known. For reliable operation of the electrical control system 1, the control strategy must be tolerant to a defect of sensor 10. Then the continuity of operation is assured and the safety requirements are met.

Currently, in the most demanding applications, redundancy of the hardware is used to surmount a failure of sensor 10. This solution renders the design of the electrical control system 1 more complex and increases its cost.

On the other hand, redundancy of the software is much more interesting owing to its development potential besides its low cost. For this purpose, a method of diagnostics based on analyzing the waveforms of the currents in a rotating reference frame (reference frame (d, q)) has been elaborated.

Figure 3:
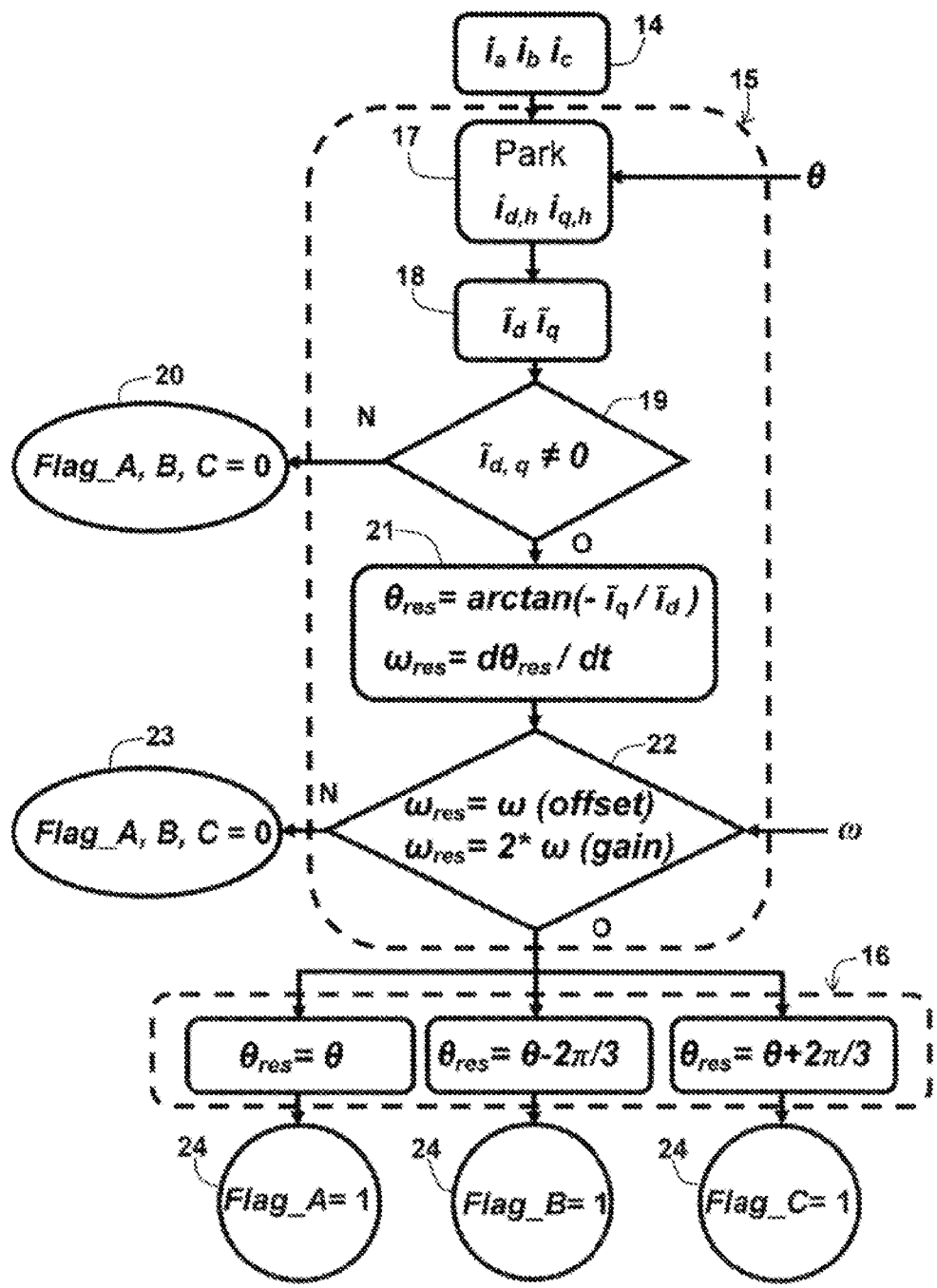
FIG. 3 is a flow chart illustrating the inventive method for diagnosing phase current sensor defects in a system for controlling a synchronous rotary electrical machine.

This method, illustrated in FIG. 3, only needs the supply 14 of phase currents $I_a$, $I_b$, $I_c$, the electrical angle θ and speed ω for detecting 15 and identifying 16 the faulty sensor among all phase current sensors 10.

Failure of only one sensor 10 is assumed, but this assumption is realistic because the probability of the simultaneous failure of two sensors is very low.

Analysis of the waveform of the currents in the rotating reference frame is detailed below.

Equations of the currents are initially given in the natural reference frame (a, b, c) and in the Park reference frame (d, q) in normal or nominal operating mode in the absence of a defect of sensor 10 (h indicates variables in this mode).

In the natural reference frame (a, b, c), the nominal values are written as follows:

$$i_{a,h} = I\cos(\theta)$$

$$i_{b,h} = I\cos\left(\theta - \frac{2\pi}{3}\right)$$

$$i_{c,h} = I\cos\left(\theta + \frac{2\pi}{3}\right)$$

The following is calculated in the Park reference frame (d, q) 17:

$$\begin{bmatrix} i_{0,h} \\ i_{d,h} \\ i_{q,h} \end{bmatrix} = \sqrt{\frac{2}{3}} \begin{bmatrix} \frac{1}{\sqrt{2}} & \frac{1}{\sqrt{2}} & \frac{1}{\sqrt{2}} \\ \cos\theta & \cos\left(\theta - \frac{2\pi}{3}\right) & \cos\left(\theta + \frac{2\pi}{3}\right) \\ -\sin\theta & -\sin\left(\theta - \frac{2\pi}{3}\right) & -\sin\left(\theta + \frac{2\pi}{3}\right) \end{bmatrix} \begin{bmatrix} i_a \\ i_b \\ i_c \end{bmatrix}$$

The consequence of a faulty sensor is then modelled in a first case of an offset error and in a second case of a gain error.

In the first case measurements 14 provided by the phase current sensors 10 are written for each of the three phases A, B, C as follows:

$$i_{am} = i_{a,h} + \Delta i_a$$

$$i_{bm} = i_{b,h} + \Delta i_b$$

$$i_{cm} = i_{c,h} + \Delta i_c$$

where:

$\Delta i_a$, $\Delta i_b$ and $\Delta i_c$ are the offsets on phases A, B and C respectively.

$i_{am}$, $i_{bm}$ and $i_{cm}$ are the measurements provided by the A, B, C phase current sensors 10 respectively.

Differences $I_d$, $I_q$ between the measurements and the nominal values are obtained 18 in the Park reference frame by means of the equations:

$$\tilde{i}_d = i_{d,h} - i_{dm} \quad \tilde{i}_q = i_{q,h} - i_{dm}$$

If the nominal values $I_{d,h}$ and $I_{q,h}$ are not known, they can be approximated by applying a time-weighted moving average to the current values.

These are for each phase A, B and C:

PhaseA
$$\begin{cases} \tilde{i}_d = \sqrt{\frac{2}{3}} \cos(\theta) \Delta i_a \\ \tilde{i}_q = -\sqrt{\frac{2}{3}} \sin(\theta) \Delta i_a \end{cases}$$

PhaseB
$$\begin{cases} \tilde{i}_d = \sqrt{\frac{2}{3}} \cos\left(\theta - \frac{2\pi}{3}\right) \Delta i_b \\ \tilde{i}_q = -\sqrt{\frac{2}{3}} \sin\left(\theta - \frac{2\pi}{3}\right) \Delta i_b \end{cases}$$

PhaseC
$$\begin{cases} \tilde{i}_d = \sqrt{\frac{2}{3}} \cos\left(\theta + \frac{2\pi}{3}\right) \Delta i_c \\ \tilde{i}_q = -\sqrt{\frac{2}{3}} \sin\left(\theta + \frac{2\pi}{3}\right) \Delta i_c \end{cases}$$

In the rotating reference frame, the currents $I_{d,h}$ and $I_{q,h}$ are direct currents in nominal mode. If an offset error appears on one of the three phase current sensors 10, a sinusoidal component $I_{d,q}$ is added to the direct currents $I_{d,h}$ and $I_{q,h}$ at the electrical frequency.

If the differences $I_{d1}$, $I_q$ are substantially zero 19 (with noise), in the inventive method flags Flag_A, B, C 20 representative of the absence of defects of sensors 10 are generated (Fla_A, B, C=0).

On the other hand, if the differences $I_d$, $I_q$ are substantially non-zero 19, in the inventive method the waveform 21 of the phase currents is analyzed in the Park reference frame by defining a residual electrical angle $\theta_{res}$ with the equation $$\theta_{res} = \arctan(-\tilde{i}_q/\tilde{i}_d)$$

and by calculating a residual pulsation $\omega_{res}$ with the expression $$\omega_{res} = d\theta_{res}/dt.$$

In the first case of an offset error, this residual pulsation $\omega_{res}$ is equal (with measurement and calculation errors) to the speed $\omega$, and, in the second case of a gain error, this residual pulsation $\omega_{res}$ is equal to twice the speed $\omega$, as shown below.

This analysis of the waveform 21 of the phase currents in the Park reference frame with the inventive method enables an absence of sensor defects to be decided 22 (Flag_A, B, C=0) 23 if no alternative component to the frequencies $\omega/2\pi$ or $\omega/\pi$ is detected.

If an alternative component is detected, in the inventive method the defect is confirmed 22 and a comparison 16 of residual electrical angle $\theta_{res}$ to the electrical angle $\theta$ enables the phase A, B, C to be determined corresponding to the faulty sensor among the three phase current sensors 10 as follows:

$$\theta_{res} = \theta \qquad \text{PhaseA}$$

$$\theta_{res} = \theta - \frac{2\pi}{3} \qquad \text{PhaseB}$$

$$\theta_{res} = \theta + \frac{2\pi}{3} \qquad \text{PhaseC}$$

According to the method of the invention, the flags Flag_A, B, C are generated 24, representing the presence of a fault on one of the phase current sensors 10 (Flag_A, B, C=1).

In the second case of a sensor defect (gain error), measurements $I_{am}$, $I_{bm}$, $I_{cm}$ provided 14 by the phase current sensors 10 are written for each of the three phases A, B, C as follows:

$$i_{am} = G_a I \cos\theta$$

$$i_{bm} = G_b I \cos\left(\theta - \frac{2\pi}{3}\right)$$

$$i_{cm} = G_c I \cos\left(\theta + \frac{2\pi}{3}\right)$$

where $G_a$, $G_b$, $G_c$ are the gains of the phase current sensors 10 for phases A, B, C respectively (in nominal mode, $G_a = G_b = G_c = 1$), and I is the current circulating in the stator windings of the synchronous rotary electrical machine 2.

Differences $I_d$, $I_q$ between the measurements and the nominal values are obtained 18 in the Park reference frame by means of the equations:

$$\tilde{i}_d = i_{d,h} - i_{dm}$$

$$\tilde{i}_q = i_{q,h} - i_{dm}$$

If the nominal values $I_{dh}$ and $I_{qh}$ are not known, they can be approximated by applying a time-weighted moving average to the current values.

There are for each phase A, B and C:

$$\begin{cases} \tilde{i}_d = \sqrt{\frac{1}{6}}(1-G_a)/(1+\cos 2\theta) \\ \tilde{i}_q = -\sqrt{\frac{1}{6}}(1-G_a)/\sin 2\theta \end{cases} \quad \text{PhaseA}$$

$$\begin{cases} \tilde{i}_d = \sqrt{\frac{1}{6}}(1-G_b)/\left(1+\cos\left(2\theta-\frac{4\pi}{3}\right)\right) \\ \tilde{i}_q = -\sqrt{\frac{1}{6}}(1-G_b)/\sin\left(2\theta-\frac{4\pi}{3}\right) \end{cases} \quad \text{PhaseB}$$

$$\begin{cases} \tilde{i}_d = \sqrt{\frac{1}{6}}(1-G_b)/\left(1+\cos\left(2\theta+\frac{4\pi}{3}\right)\right) \\ \tilde{i}_q = -\sqrt{\frac{1}{6}}(1-G_b)/\sin\left(2\theta+\frac{4\pi}{3}\right) \end{cases} \quad \text{PhaseC}$$

These equations show that, if a gain error appears on one of the three phase current sensors 10, a sinusoidal component $I_{d,q}$ is added to the direct currents $I_{d,h}$ and $I_{q,h}$ at twice the electrical frequency.

The device for diagnosing defects of phase current sensors 10 in a control system 1 of a synchronous rotary electrical machine 2 of a motor vehicle, also aimed at by the invention, is a specific module 25 implementing the method described above and integrated in the control unit 3 shown on FIG. 2.

This specific module 25, according to a commonly known architecture, comprises:

means to acquire measurements of the phase currents $I_a$, $I_b$, $I_c$, provided by sensors 10 and an electrical angle $\theta$ of the control system 1;

means to digitally process these measurements;

means to generate flags Flag_A, B, C 20, 23, 24 indicating the absence or presence of a fault on one of sensors 10.

Insofar as the control unit 3 already comprises a microprocessor, a microcontroller or an analogue digital circuit, implementing in particular the closed control loop 11, these means of acquisition, these means of digital processing and these means of generation are those of the control unit 3.

A computer code, representative of the inventive method, stored in a memory 26, enables this common architecture to be used:

to perform the necessary Park transformation;

to analyze the waveforms of the phase currents in the Park reference frame;

to detect offset and/or gain errors of the sensors 10;

to identify the faulty sensor.

The flags Flag_A, B, C 20, 23, 24 are taken into account by the closed control loop 11 in order to reconfigure the processing algorithms so as to ensure continuous operation of the control system 1, even in the event of failure of the one of the phase current sensors 10.

The inventive method and device are robust by virtue of using a non-parametric approach separate from an electromechanical model of the machine 2.

It goes without saying that the invention is not limited to the single preferred embodiment described above. Other embodiments would not depart from the framework of this invention insofar as they result from the claims below.

The invention claimed is:

1. A method (15, 16) for diagnosing defects of phase current sensors (10) in a control system (1) of a synchronous rotary electrical machine (2) of a motor vehicle, the method comprising the step of taking into account differences ($\tilde{I}_d$, $\tilde{I}_q$) between measurements of phase currents of each of phases of the synchronous rotary electrical machine (2) provided (14) by the phase current sensors (10) and nominal values of phase currents ($I_a$, $I_b$, $I_c$) of each of the phases of the synchronous rotary electrical machine (2) in order to diagnose defects if differences ($\tilde{I}_d$, $\tilde{I}_q$) are non-zero (19), the differences ($\tilde{I}_d$, $\tilde{I}_q$) being calculated (18) in a rotating Park reference frame (17) and being separate from an electromechanical model of the rotary electrical machine (2), a faulty sensor among the phase current sensors (10) being identified by comparing a residual electrical angle $\theta_{res}$ to a measured electrical angle $\theta$ of the control system (1), the residual electrical angle $\theta_{res}$ defined by the equation:

$$\theta_{res} = \arctan(\tilde{I}_q, \tilde{I}_d)$$

where ($\tilde{I}_d$, $\tilde{I}_q$) are the differences.

2. The method (15, 16) according to claim 1, wherein an offset error of at least one of the phase current sensors (10) is detected (21, 22) if a residual pulsation ($\omega_{res}$) of the differences ($\tilde{I}_d$, $\tilde{I}_q$) is equal to a measured speed ($\omega$) of the control system (1).

3. A diagnosing device (25) for diagnosing defects of phase current sensors (10) in a control system (1) of a synchronous rotary electrical machine (2) of a motor vehicle capable of implementing the method according to claim 2, the diagnosing device (25) comprising:

an acquisition device configured to acquire measurements ($I_a$, $I_b$, $I_c$) provided by the phase current sensors (10) and an electrical angle ($\theta$) of the control system (1);

a processing device configured to digitally process the measurements ($I_a$, $I_b$, $I_c$);

a generating device configured to generate flags indicating said defects of sensors (10); and a treatment device configured to perform a Park transformation and comprising an analyzing device configured to analyze waveforms of the phase currents ($I_a$, $I_b$, $I_c$) in the rotating Park reference frame (17), the analyzing device including a calculating device configured to calculate a time-weighted moving average.

4. The method (15, 16) according to claim 1, wherein a gain error of at least one of the phase current sensors (10) is detected (21, 22) if a residual pulsation of the differences ($\tilde{I}_d$, $\tilde{I}_q$) is equal to twice a measured speed ($\omega$) of the control system (1).

5. A diagnosing device (25) for diagnosing defects of phase current sensors (10) in a control system (1) of a synchronous rotary electrical machine (2) of a motor vehicle capable of implementing the method according to claim 4, the diagnosing device (25) comprising:

an acquisition device configured to acquire measurements ($I_a$, $I_b$, $I_c$) provided by the phase current sensors (10) and an electrical angle ($\theta$) of the control system (1);

a processing device configured to digitally process the measurements ($I_a$, $I_b$, $I_c$);

a generating device configured to generate flags indicating said defects of sensors (10); and a treatment device configured to perform a Park transformation and comprising an analyzing device configured to analyze waveforms of the phase currents ($I_a$, $I_b$, $I_c$) in the rotating Park reference frame (17), the analyzing device including a calculating device configured to calculate a time-weighted moving average.

6. A diagnosing device (25) for diagnosing defects of phase current sensors (10) in a control system (1) of a synchronous rotary electrical machine (2) of a motor vehicle configured to implement the method according to claim 1, the diagnosing device (25) comprising:

an acquisition device configured to acquire measurements ($I_a$, $I_b$, $I_c$) provided by the phase current sensors (10) and an electrical angle ($\theta$) of the control system (1);

a processing device configured to digitally process the measurements ($I_a$, $I_b$, $I_c$);

a generating device configured to generate flags indicating said defects of sensors (10); and a treatment device configured to perform a Park transformation and comprising an analyzing device configured to analyze waveforms of the phase currents ($I_a$, $I_b$, $I_c$) in the rotating Park reference frame (17), the analyzing device including a calculating device configured to calculate a time-weighted moving average.

7. The diagnosing device (25) according to claim 6, wherein the acquisition device is further configured to acquire a speed ($\omega$) of the control system (1), and wherein the treatment device further comprises a detecting device configured to detect an offset error and/or a gain error of at least one of the phase current sensors (10) as a function of the speed ($\omega$).

8. The diagnosing device (25) according to claim 7, wherein the treatment device further comprises an identification device configured to identify a faulty sensor among the phase current sensors (10) as a function of the electrical angle ($\theta$).

9. The synchronous rotary electrical machine (2) comprising at least one integrated control system (1), the at least one integrated control system (1) including the diagnosing device (25) for diagnosing phase current sensor defects of the at least one integrated control system (1) according to claim 6.

10. A semiconductor memory (26) integrated in the diagnosing device (25) according to claim 6.

11. The synchronous rotary electrical machine (2) comprising at least one integrated control system (1), the at least one integrated control system (1) including the diagnosing device (25) according to claim 7.

12. The synchronous rotary electrical machine (2) comprising at least one integrated control system (1), the at least one integrated control system (1) including the diagnosing device (25) according to claim 8.

13. A semiconductor memory (26) integrated in the diagnosing device (25) according to claim 7.

14. A semiconductor memory (26) integrated in the diagnosing device (25) according to claim 8.

* * * * *